(12) United States Patent
Poechmueller

(10) Patent No.: US 7,162,382 B2
(45) Date of Patent: Jan. 9, 2007

(54) APPARATUS AND METHOD FOR CALIBRATING SIGNALS

(75) Inventor: Peter Poechmueller, Unterhaching (DE)

(73) Assignee: Infineon Technologies AG, Munich (DE)

( * ) Notice: Subject to any disclaimer, the term of this patent is extended or adjusted under 35 U.S.C. 154(b) by 498 days.

(21) Appl. No.: 10/618,056

(22) Filed: Jul. 11, 2003

(65) Prior Publication Data

US 2004/0054482 A1     Mar. 18, 2004

(30) Foreign Application Priority Data

Jul. 11, 2002   (DE) ................. 102 31 419

(51) Int. Cl.
*G06F 3/01*   (2006.01)

(52) U.S. Cl. .................. 702/79; 702/81; 702/182; 702/183

(58) Field of Classification Search .......... 702/79, 702/125, 85, 89, 57, 91, 182, 183; 324/74, 324/130, 601, 763; 707/10; 326/30; 327/77, 327/78, 80

See application file for complete search history.

(56) References Cited

U.S. PATENT DOCUMENTS

| | | | | |
|---|---|---|---|---|
| 4,554,636 A * | 11/1985 | Maggi et al. | ................ | 702/118 |
| 6,260,154 B1 | 7/2001 | Jeddeloh | ................ | 713/401 |
| 6,448,799 B1 * | 9/2002 | Niwa | ................ | 324/763 |
| 6,462,591 B1 * | 10/2002 | Garrett et al. | ................ | 327/112 |
| 6,609,077 B1 * | 8/2003 | Brown et al. | ................ | 702/117 |
| 6,631,340 B1 * | 10/2003 | Sugamori et al. | ................ | 702/122 |
| 6,880,137 B1 * | 4/2005 | Burlison et al. | ................ | 716/4 |
| 7,084,662 B1 * | 8/2006 | Om et al. | ................ | 326/30 |
| 2002/0160558 A1 | 10/2002 | Ernst et al. | | |
| 2003/0056148 A1 | 3/2003 | Kiehl et al. | | |
| 2004/0183559 A1 * | 9/2004 | Ware et al. | ................ | 324/763 |

FOREIGN PATENT DOCUMENTS

| | | |
|---|---|---|
| DE | 100 34 852 | 2/2002 |
| DE | 101 45 745 | 4/2003 |

* cited by examiner

*Primary Examiner*—Marc S. Hoff
*Assistant Examiner*—Felix Suarez
(74) *Attorney, Agent, or Firm*—Schiff Hardin LLP

(57) ABSTRACT

The invention is directed to a device for calibrating signals, whereby at least two signal circuits are provided for generating signals. In order to calibrate the signals, elements are provided that evaluate the signals generated by the signal circuits and, dependent thereon, drive at least one of the at least two signal circuits such that the time reference of the signals generated by the signal circuits relative to one another is set corresponding to at least one prescribed value.

22 Claims, 1 Drawing Sheet

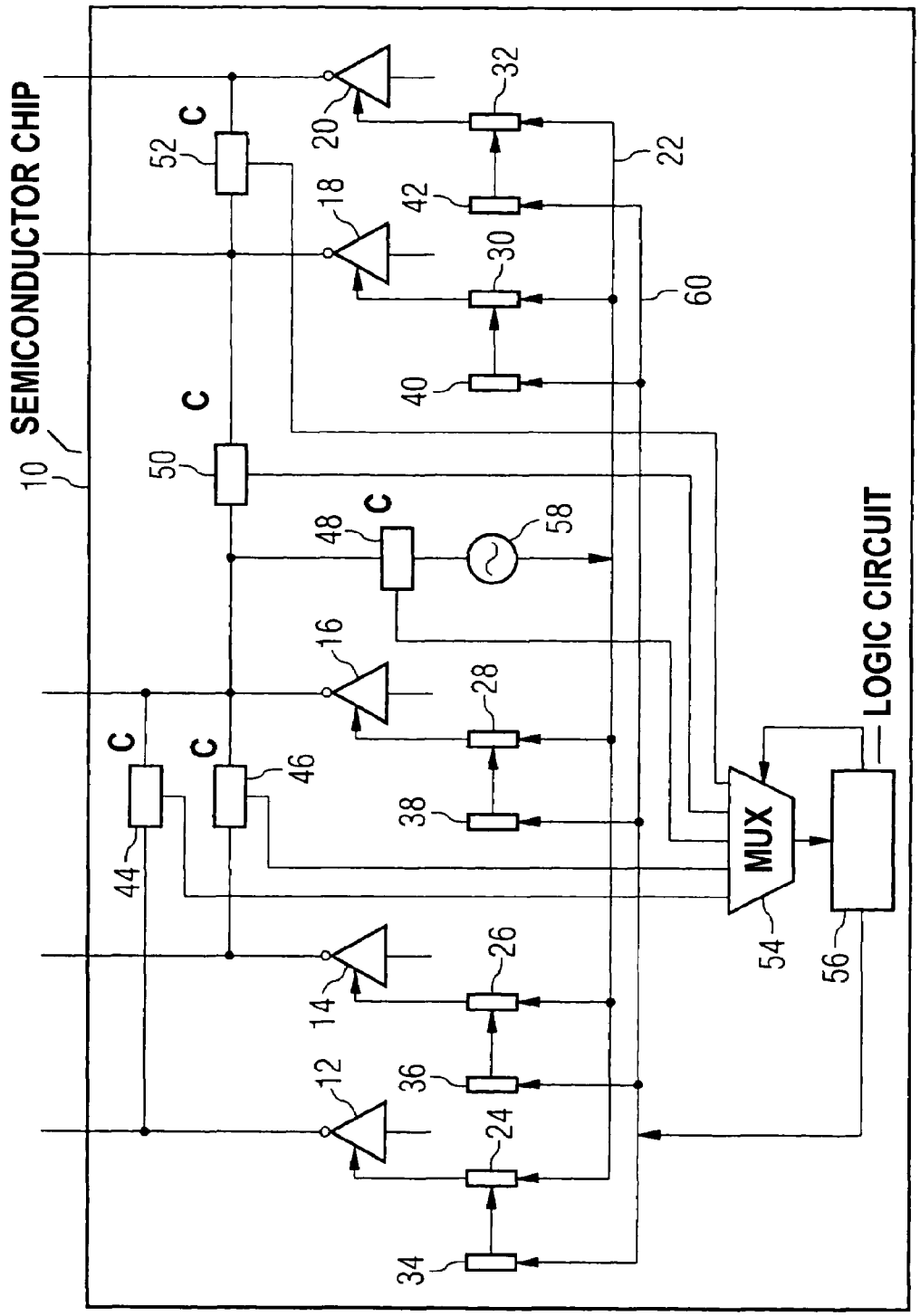

APPARATUS AND METHOD FOR CALIBRATING SIGNALS

BACKGROUND OF THE INVENTION

1. Field of the Invention

The invention is directed to a Device for calibrating signals, whereby at least two signal circuits are provided for generating signals. The invention is also directed to a method for calibrating signals, whereby at least two signal circuits are provided for generating signals.

2. Description of the Related Art

Dynamic memories (DRAMs: Dynamic Random Access Memories) are tested with specific production test machines. Such a machine generates high-precision signals that are conducted to and applied to a memory component under test (DUT: Device under Test). A "high-precision signal" is a signal whose voltage level is very precisely set and that can be generated at precisely defined points in time. These production test machines likewise enable a precise detection of the signals generated by a DUT. I.e., specifically, these signals can be sampled at precisely defined points in time, read into a production test machine, and compared to comparison signals (what are referred to as the "anticipated signals").

Clock frequencies up to 400 MHz are achieved given the technologies that are currently available in the DRAM field, e.g., RAMBUS or DDR (Double Data Rate) memories. Such memories require high-precision signals for testing whose specifications must currently be defined in a time range of approximately 500 ps. Shorter time ranges into a region of a few ps can be anticipated in future. These demands must be met by production test machines. An especially precise signal electronics is required for this purpose, but this produces very high costs.

Moreover, such production test machines usually make a plurality of independent input and output channels available that are at least partly programmable. These input and output channels are compared to an internal time reference of the machine and to data patterns generated in the machine. The input and output channels are therefore driven via complex pin cards with a plurality of ASICs (Application Specific Integrated Circuits) and electronic components. It is particularly the ASICs that cause very high costs since one ASIC is usually provided for each input and output channel; this ASIC is also referred to as "pin electronics".

SUMMARY OF THE INVENTION

An object of the present invention is to provide an apparatus and a method for calibrating signals that make it possible to generate high-precision signals cost-beneficially.

This object is achieved by a device for calibrating signals, comprising at least two signal circuits configured to generate signals; and evaluation-drive circuitry configured to evaluate the signals generated by the signal circuits and, dependent thereon, drive at least one of the signal circuits such that a time reference of the signals generated by the signal circuits relative to one another is set corresponding to at least one prescribed value.

This object is also achieved by a method for calibrating signals, comprising providing at least two signal circuits for generating signals; generating signals by the at least two signal circuits; evaluating the signals generated by the signal circuits; and driving at least one of the at least two signal circuits such that a time reference of the signals generated by the signal circuits relative to one another is set corresponding to at least one prescribed value.

DESCRIPTION OF THE DRAWINGS

An exemplary embodiment of the invention is presented in greater detail below on the basis of the sole drawing. The FIGURE is a schematic block diagram of an exemplary embodiment of the device for calibrating signals.

DETAILED DESCRIPTION OF THE PREFERRED EMBODIMENTS

A preferred embodiment of the invention generate precise, i.e., temporally high-precision, signals in that the signals are calibrated with one another, i.e., matched in time to one another, particularly by using a comparison. This method also proves especially advantageous given an implementation in an integrated circuit since signals that are at a relatively great spatial distance from one another can also be calibrated with one another without a great circuit-oriented outlay.

Temperature fluctuations are also compensated for, just as are imprecisions due to different transit times of the signals. An expensive pin electronics can therefore be constructed far simpler and—above all—more cost-beneficially. A preferred embodiment may be advantageously utilized particularly given an employment in a BOST (Built Outside Self Test) concept for testing complex integrated circuits, since only a slight circuit-oriented outlay is required. This enables an implementation of comparatively small ASICs that can be arranged close to a DUT, as a result of which line transit times or differences in transit times of signals can be reduced and the precision and frequency can be increased. Moreover, these ASICs can be very cost-beneficially produced in great unit numbers. Finally, no complex busses need be conducted, for example, on a semiconductor chip.

An apparatus is provided for calibrating signals in which at least two signal circuits are provided for generating signals. Further, mechanisms are provided for the calibrating that evaluate the signals generated by the signal circuits and drive at least one of the at least two signal circuit dependent thereon such that the time reference of the signals generated by the signal circuits is set relative to one another corresponding to at least one prescribed value. For example, the prescribed value can be 0; in this case, the signals should be calibrated such that they exhibit only a small or—optimally—no time offset at all. However, any other arbitrary value can be prescribed that determines the time reference of the signals to one another or, to be more precise, the time offset of the signals.

At least one comparator may be used that is allocated to at least two signal circuits and that compares the signals generated by the at least two signal circuits to one another. Comparators are circuits that are constructed relatively simply in circuit-oriented terms and that have only a small space requirement, particularly on an integrated circuit, i.e. on a semiconductor chip.

A logic circuit may be provided that evaluates the output signal of the at least one comparator. Such a logic circuit can be realized, for example, in the form of a small processor or of an automatic state unit. The prescribed value should be programmable and should be resident in a volatile or non-volatile, programmable memory.

Further, at least one programmable delay loop may be provided. A programmable delay loop may be allocated to at least one signal circuit in order to set the delay of the signal circuit. For example, a series circuit of digital delay elements can be utilized as a programmable delay loop, the plurality of active delay elements, i.e., the plurality of delay elements connected into the delay path, being programmable therein. Of course, other known delay loops can also be utilized.

At least one register may be provided in which a delay value that can be stored is allocated to at least one programmable delay loop. In other words, a delay value for a signal circuit that is determined by the logic circuit is stored in the register. This delay value can then be read out by the delay loop allocated to the register. The delay of the signal circuit is set in conformity with the delay value that is read out.

The at least one register is preferably connected to the logic circuit via a register bus. A plurality of registers are thus connected via this register bus so that the outlay for wiring the registers is kept low.

In order to keep the circuit outlay as low as possible, the circuit can comprise at least one multiplexer to which output signals of comparators are supplied. This fundamentally enables a sequential processing of the comparison results of the comparators by the logic circuit. To that end, the multiplexer is preferably controlled by the logic circuit since the logic circuit determines the executive sequence of the calibration.

A signal generator can also be provided that generates a reference signal with which the signals generated by the signal circuits can be calibrated. As a result, a calibration with reference to an optimally exact time reference that is supplied by the signal generator can be implemented. In other words, the signals to be calibrated are set to the reference signal.

To this end, the reference signal that is generated by the signal generator is preferably supplied to at least one comparator.

Especially advantageously, the inventive device can be at least partially implemented on a semiconductor chip.

Particularly for reducing the technological outlay of the initially cited production test machines, the inventive device can be implemented on an ASIC that is fashioned for testing dynamic memory components, particularly for a self-test of dynamic memory components. Such an ASIC can be advantageously utilized on a pin card of a production test machine, for example, as a replacement for the component parts previously provided for each input and output channel of the production test machine.

In a preferred embodiment of the inventive device, the signal circuits are drivers, particularly inverting, controllable drivers.

An inventive method is provided for calibrating signals wherein at least two signal circuits for generating signals are provided. In a preferred embodiment of the method, the signals generated by the signal circuits are evaluated; depending on these, at least one of the at least two signal circuits is then driven such that the time reference of the signals generated by the signal circuits relative to one another is set according to at least one prescribed value.

Depending on the comparison result, at least one of the signal circuits can be programmed such that the signal it generates is delayed according to the prescribed value.

In a preferred embodiment, the evaluation and programming ensue using a logic circuit that executes an algorithm comprising the prescribed value for this purpose. For example, the algorithm can be deposited in a small memory as a program; however, the logic circuit can also be fashioned as, for example, an automatic state machine or hardwired logic that realizes the algorithm. The prescribed value is preferably programmable in that, for example, it is stored in the logic circuit in a register provided for that purpose. For example, the register can be fashioned as static, dynamic volatile or programmable non-volatile memory.

In order to keep the circuit-oriented and the methodological outlay as low as possible, the logic circuit preferably sequentially evaluates a plurality of comparison results. Although the calibration event is lengthened in time overall as a result, a separate logic circuit is not required for the evaluation of each comparison result. Of course, a plurality of logic circuits, particularly logic circuits working in parallel, can be provided in order to shorten the time required for the calibration event, for example, when a calibration is implemented very frequently and the time to be expended overall for the calibrating should be as short as possible.

Given a logic circuit for the sequential evaluation of a plurality of comparison results, this may be correspondingly driven by a multiplexer; the comparison results pend at the inputs of the multiplexer. "Correspondingly driven" means a selection of the individual comparison results that is controlled by the algorithm.

For the programming, the logic circuit preferably drives at least one of at least two registers via a register bus (these registers being respectively allocated to the signal circuits) and stores a delay value therein.

A delay value stored in a register can then be read by a programmable delay loop that in turn programs a signal circuit according to the delay value that has been read or, to be more precise, sets the delay of the signal circuit in the output of a signal.

The FIGURE illustrates an embodiment of the inventive device for calibrating signals. The device is preferably implemented on a semiconductor chip 10. Inverting controllable drivers 12, 14, 16, 18 and 20 are provided as signal circuits, these generating signals that, for example, can be conducted outside the semiconductor chip 10 for test purposes. These signals should be generated—calibrated, to be more precise—with high precision in terms of time. Insofar as possible, all signals should be generated at nearly the same time. To be more precise, signal changes should be generated at the same points in time insofar as possible. The drivers 12, 14, 16, 18 and 20 are therefore controlled by the same control clock 22. This is respectively conducted to the drivers 12, 14, 16, 18 or 20 via a programmable delay loop 24, 26, 28, 30 or 32. A delay value of the delay loops 24, 26, 28, 30 or 32 can be respectively programmed via registers 34, 36, 38, 40, 42. To this end, the registers 34, 36, 38, 40, 42 may be connected to a logic circuit 56 via a shared register bus 60. The function of the logic circuit 56 is explained in greater detail below.

When the same delay value is programmed everywhere via the registers 34, 36, 38, 40, 42, then all drivers 12, 14, 16, 18 and 20 should drive their output signal values at approximately the same time. In practice, however, considerable time deviations usually derive. These are caused by—among other things—transit time differences of the control clock, locally different heating due to the circuit operation and different line impedances that are especially connected therewith, imprecise realization of the delay loops 24, 26, 28, 30, 32 and locally deviating layout fluctuations of gate lengths of the transistors that are utilized. In particular, greater deviations cannot be avoided when the individual signal circuits—particularly drivers—are spatially far apart, for example, on a complex integrated circuit, a larger ASIC or a dynamic memory module. The following assumes, according to the FIGURE (by way of example) that the drivers 16 and 18 are spatially far apart on the semiconductor chip 10.

The embodiment of the calibration method as shown in the FIGURE employed in order to reduce such fluctuations. The output signals of the drivers 12, 14, 16, 18 and 20 on the semiconductor chip 10 are thereby fed back and respectively supplied to a comparator 44, 46, 48, 50, 52. As already mentioned, particularly the drivers 16 and 18 in the FIGURE may be arranged separated from one another by a relatively great spatial distance. It is initially expedient to directly compare signals that are spatially far apart to one another. The signals of the drivers 16 and 18 are therefore compared with the comparator 50. Care should be exercised to see that the leads to the comparators be respectively kept of approximately the same length in order—optimally—to avoid transit time differences due to leads of different lengths (or at least to keep these differences small).

The comparison result of comparator 50 may be supplied to the previously mentioned logic circuit 56 via a multiplexer 54. Which of the signals compared to one another is chronologically slower follows from the comparison or comparator result. The following presumes, for further explanation, that the signal generated by the driver 16 is slower. The logic circuit therefore reduces the content of the register 38 allocated to the driver 16 in order to reduce the corresponding delay loop 28. As a result, the signal generated by driver 16 is generated somewhat earlier. This procedure is repeated until the signals generated by drivers 16 and 18 are generated nearly simultaneously.

Subsequently, the signals generated by drivers 16 and 18 are chronological synchronized with one another. Since the comparators 44, 46, 48, 50 and 52 are respectively connected to the appertaining drivers 12, 14, 16, 18 and 20 by lines of equal length, practically no imprecisions arise as a result. Only logical data are transmitted from the comparators 44, 46, 48, 50 and 52 to the logic circuit 56 or from the logic circuit 56 to the registers 34, 36, 38, 40 and 42, i.e., no imprecision in the calibration arises as a result even given long line lengths. Transit time differences on the line for the control clock 22 to the various delay loops 24, 26, 28, 30 and 32 are calibrated out since the output signals of the drivers 12, 14, 16, 18 and 20 are respectively directly compared to one another.

Proceeding from the drivers 16 and 18, all other drivers 12, 14 and 20 can now be compared to these in order to calibrate all signals with one another. Comparison should thereby always be to the same reference insofar as possible in order to avoid additional imprecisions. In the exemplary embodiment, both the driver 12 as well as the driver 14 are compared to the driver 16. Although this requires a wiring over longer distances, it is nonetheless acceptable since the drivers 12, 14 and 16 are arranged topically close on the semiconductor chip 10. Of course, care should be exercised to ensure that the register content of the "reference" driver 16 is no longer modified.

Effectively all drivers 12, 14, 16, 18 and 20 can be successively calibrated with one another via the multiplexer 54, as a result of which one logic circuit 56 suffices.

A group of signals can be brought into optimally exact time coincidence with one another with an embodiment of the invention. When it is desirable to also produce the coincidence with respect to a prescribed, exact time reference, this can likewise ensue utilizing an embodiment of the invention. This is shown in the FIGURE by use of the comparator 48 and a signal generator 58. Here, the signal generator is a reference signal source that generates a horologically high-precision reference signal (for example an extremely precise clock). The first comparison should occur between the signal generator 58 and, for example, the driver 16. The driver 16 is thus synchronized with signal source 58. All further comparisons can now occur with reference to the driver 16—as presented above.

An embodiment of the invention can also be utilized in order to produce signal groups with different time relationship; for example, the drivers 12, 14 and 16 could be calibrated to the signal generator 58. When a further reference signal generator and an additional comparator are provided, the drivers 18 and 20 can be calibrated to this second reference signal generator, for example, independently from the drivers 12, 14 and 16.

For the purposes of promoting an understanding of the principles of the invention, reference has been made to the preferred embodiments illustrated in the drawings, and specific language has been used to describe these embodiments. However, no limitation of the scope of the invention is intended by this specific language, and the invention should be construed to encompass all embodiments that would normally occur to one of ordinary skill in the art.

The present invention may be described in terms of functional block components and various processing steps. Such functional blocks may be realized by any number of hardware and/or software components configured to perform the specified functions. For example, the present invention may employ various integrated circuit components, e.g., memory elements, processing elements, logic elements, look-up tables, and the like, which may carry out a variety of functions under the control of one or more microprocessors or other control devices. Furthermore, the present invention could employ any number of conventional techniques for electronics configuration, signal processing and/or control, data processing and the like.

The particular implementations shown and described herein are illustrative examples of the invention and are not intended to otherwise limit the scope of the invention in any way. For the sake of brevity, conventional electronics, control systems, software development and other functional aspects of the systems (and components of the individual operating components of the systems) may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device. Moreover, no item or component is essential to the practice of the invention unless the element is specifically described as "essential" or "critical". Numerous modifications and adaptations will be readily apparent to those skilled in this art without departing from the spirit and scope of the present invention.

LIST OF REFERENCE CHARACTERS 10 semiconductor chip
12 driver
14 driver
16 driver
18 driver
20 driver
22 control clock
24 programmable delay loop
26 programmable delay loop
28 programmable delay loop 30 programmable delay loop
32 programmable delay loop
34 register
36 register
38 register
40 register
42 register
44 comparator
46 comparator
48 comparator
50 comparator
52 comparator
54 multiplexer
56 logic circuit
58 signal generator
60 register bus

What is claimed is:

1. A device for calibrating signals, comprising:
   at least two signal circuits configured to generate signals; and
   evaluation-drive circuitry configured to evaluate the signals generated by the signal circuits and, dependent thereon, drive at least one of the signal circuits such that a time reference of the signals generated by the signal circuits relative to one another is set corresponding to at least one prescribed value.

2. The device according to claim 1, wherein the evaluation-drive circuitry further comprises at least one comparator that is allocated to the at least two signal circuits and that is configured to compare the signal generated by the at least two signal circuits to one another.

3. The device according to claim 2, wherein the evaluation-drive circuitry further comprises a logic circuit configured to evaluate an output signal of the at least one comparator.

4. The device according to claim 1, wherein the evaluation-drive circuitry further comprises at least one programmable delay loop, and a programmable delay loop is allocated to at least one signal circuit in order to set a delay of the signal circuit.

5. The device according to claim 4, wherein the evaluation-drive circuitry further comprises at least one register and a register in which a delay value can be stored is allocated to at least one programmable delay loop.

6. The device according to claim 5, wherein the at least one register is connected to a logic circuit configured to evaluate an output signal of the at least one comparator via a register bus.

7. The device according to claim 1, wherein the evaluation-drive circuitry further comprises at least one multiplexer to which output signals of comparators are supplied.

8. The device according to claim 7, wherein the multiplexer is controlled by a logic circuit configured to evaluate an output signal of the at least one comparator.

9. The device according to claim 1, further comprising:
   a signal generator configured to generate a reference signal with which the signals generated by the signal circuits can be calibrated.

10. The device according to claim 9, wherein the reference signal that is generated by the signal generator is supplied to at least one comparator.

11. The device according to claim 1, wherein the signal circuits are drivers.

12. A semiconductor chip comprising the device according to claim 1.

13. An ASIC comprising the device according to claim 1 that is configured for testing dynamic memory modules.

14. A component comprising the device according to claim 1 for performing a self-test on the component.

15. A method for calibrating signals, comprising:
   providing at least two signal circuits for generating signals;
   generating signals by the at least two signal circuits;
   evaluating the signals generated by the signal circuits; and
   driving at least one of the at least two signal circuits such that a time reference of the signals generated by the signal circuits relative to one another is set corresponding to at least one prescribed value.

16. The method according to claim 15, further comprising:
   comparing the signals generated by the at least two signal circuits to one another for the evaluation and producing a comparison result.

17. The method according to claim 16, further comprising:
   programming at least one of the signal circuits dependent on the comparison result such that the signal it generates is delayed according to the prescribed value.

18. The method according to claim 17, further comprising:
   providing a logic circuit comprising an algorithm; and
   executing, by the algorithm, the evaluating and programming utilizing the prescribed value.

19. The method according to claim 18, further comprising:
   sequentially evaluating, by the logic circuit, a plurality of comparison results.

20. The method according to claim 19, further comprising:
   driving, by the logic circuit, for the sequential evaluation of a plurality of comparison results, a multiplexer at whose inputs the comparison results are adjacent.

21. The method according to claim 17, wherein the programming comprises:
   driving, by the logic circuit, at least one of at least two registers via a register bus; and
   storing a delay value in the at least one register, the at least two registers being respectively allocated to the signal circuits.

22. A method according to claim 21, further comprising:
   reading the delay value stored in a register by a programmable delay loop that in turn programs a signal circuit according to the delay value that is read.

* * * * *